(12) United States Patent
Kinnard et al.

(10) Patent No.: US 6,635,117 B1
(45) Date of Patent: Oct. 21, 2003

(54) ACTIVELY-COOLED DISTRIBUTION PLATE FOR REDUCING REACTIVE GAS TEMPERATURE IN A PLASMA PROCESSING SYSTEM

(75) Inventors: David W. Kinnard, Olney, MD (US); Daniel B. Richardson, Westminister, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/560,538

(22) Filed: Apr. 26, 2000

(51) Int. Cl.$^7$ .......................... C23C 16/00; H05H 1/00
(52) U.S. Cl. ............... 118/723; 118/724; 156/345.34; 156/345.33; 156/345.37; 156/345.47
(58) Field of Search .............. 118/724, 723 E, 118/723 MW; 156/345.34, 345.47, 345.33, 345.37

(56) References Cited

U.S. PATENT DOCUMENTS

| | | | |
|---|---|---|---|
| 5,212,116 A | * 5/1993 | Yu | 438/697 |
| 5,449,410 A | 9/1995 | Chang et al. | 118/723 ER |
| 5,595,606 A | * 1/1997 | Fujikawa et al. | 118/725 |
| 5,653,806 A | 8/1997 | Van Buskirk | 118/715 |
| 5,906,683 A | * 5/1999 | Chen et al. | 118/724 |
| 5,908,508 A | 6/1999 | Vanell et al. | 118/723 E |
| 5,968,275 A | * 10/1999 | Lee et al. | 1118/723 R |
| 6,143,081 A | * 11/2000 | Shinriki et al. | 118/719 |
| 6,197,121 B1 | * 3/2001 | Gurary et al. | 118/725 |
| 6,415,736 B1 | * 7/2002 | Hao et al. | 118/723 E |

FOREIGN PATENT DOCUMENTS

JP   8-218171 A   * 8/1996   ............ C23C/16/44

OTHER PUBLICATIONS

US 5,961,723, 10/1999, Roithner et al. (withdrawn)

* cited by examiner

*Primary Examiner*—Parviz Hassanzadeh
(74) *Attorney, Agent, or Firm*—Eschweiler & Associates, LLC (57) ABSTRACT

A plasma processing system is provided, having processor integral cooling passages for reducing an operating temperature thereof during processing of a wafer by the system. Cooling medium inlets and outlets are connected to the cooling passages to permit circulation of a cooling medium through the cooling passages. The baffle plate comprises a generally planar, apertured, gas distribution central portion surrounded by a flange into both of which the cooling passages may extend. Further, the baffle plate may have a non-apertured plate overlying and covering apertures in a central portion of the baffle plate.

9 Claims, 6 Drawing Sheets

ACTIVELY-COOLED DISTRIBUTION PLATE FOR REDUCING REACTIVE GAS TEMPERATURE IN A PLASMA PROCESSING SYSTEM

RELATED APPLICATION

The following U.S. patent application is incorporated by reference herein as if it had been fully set forth: application Ser. No.: 09/558,606, filed on Apr. 26, 2000, entitled Gas Distribution Plate Assembly for Providing Laminar Flow Across the Surface of a Substrate.

FIELD OF THE INVENTION

The present invention relates generally to the field of semiconductor plasma processing systems such as photoresist ashers, and more specifically to a actively-cooled distribution plate for reducing reactive gas temperature for use in such systems.

BACKGROUND OF THE INVENTION

In the manufacture of integrated circuits, photolithography techniques are used to form integrated circuit patterns on a substrate, such a silicon wafer. Typically, the substrate is coated with a photoresist, portions of which are exposed to ultraviolet (UV) radiation through a mask to image a desired circuit pattern on the photoresist. The portions of the photoresist left unexposed to the UV radiation are removed by a processing solution, leaving only the exposed portions on the substrate. These remaining exposed portions are baked during a photostabilization process to enable the photoresist to withstand subsequent processing.

After such processing, in which the integrated circuit components are formed, it is generally necessary to remove the baked photoresist from the wafer. In addition, residue that has been introduced on the substrate surface through processes such as etching must be removed. Typically, the photoresist is "ashed" or "burned" and the ashed or burned photoresist, along with the residue, is "stripped" or "cleaned" from the surface of the substrate. One manner of Removing photoresist and residues is by rapidly heating the photoresist-covered substrate in a vacuum chamber to a preset temperature by infrared radiation, and directing a microwave-energized reactive plasma toward the heated substrate surface. In the resulting photoresist ashing process, wherein the reactive plasma reacts with the photoresist, the hot reactive gases in the plasma add heat to the surface of the substrate by means of convection. Heat energy on the order of 100 millliwatts per square centimeter ($mW/cm^2$) is also added to the wafer as a result of the surface reaction. Excessive heat on the surface of the wafer can damage devices or portions thereof which have been formed on or in the wafer. In addition, excessive heat on the surface of the wafer can cause photoresist cracking during, for example, high-density ion implanted (HDII) wafer ash processes.

Reducing the temperature of the ashing process in the chamber will slow the reaction rate and thus the amount of heat added to the wafer by the surface reaction. However, the gas temperature, which is a function of the gas mixture and the applied microwave power, will remain unaffected by the reduced process temperature. The problem is exacerbated if the process includes a reaction catalyst such as carbon tetrafluoride ($CF_4$) which tends to increase the rate of reaction due to increased production of atomic oxygen. As a result, the catalyst-assisted process results in higher temperature gases, even at lower process temperatures.

A typical plasma processing apparatus is shown in U.S. Pat. No. 5,449,410 to Chang et al. wherein an aluminum baffle plate or showerhead is provided for distributing gas into a plasma chamber. However, no means of controlling the temperature of the gas is shown. Accordingly, the apparatus shown will suffer from the adverse effects of high temperature gases as described above.

In addition, because individual wafers are processed in a serial fashion by known single-wafer process chambers, systems such as that shown in U.S. Pat. No. 5,449,410 exhibit a phenomenon known as the "first wafer effect", which refers to secondary heating of subsequent wafers caused indirectly by the heating of the first-processed wafer. Specifically, upon completion of processing of the first wafer, the heated processed wafer and the process chamber side walls radiate heat toward the gas distribution baffle plate (typically made from quartz). The heated quartz plate then indirectly provides a secondary heating mechanism for subsequent wafers that are processed in the chamber. As a result, the first and subsequent wafers processed by the system exhibit process non-uniformities.

Still another problem with known baffle plates is that thermal gradients develop across the surface of the baffle plate. Because such baffle plates are typically made of quartz, due to their ability to withstand high process temperatures, they tend to exhibit poor thermal conductivity as well as undesirable infrared (IR) wavelength absorption characteristics. In addition, the temperature of a quartz baffle plate can be difficult to control if IR wavelength energy is absorbed from the wafer with no means for sinking or dissipating the absorbed radiant energy. As a result, process uniformity and system throughput are adversely affected.

Thus, it is an object of the present invention to provide a mechanism for reducing the temperature of gases used in a wafer processing system such as a photoresist asher to prevent damage to the wafer during the ashing process. It is a further object of the present invention to reduce the temperature of reactive gases required by low temperature processes, by incorporating cooling means into a gas distribution or baffle plate used therein. It is yet a further object of the invention to improve wafer-to-wafer process uniformity in such processes, by eliminating secondary heating caused by the "first wafer effect". It is still a further object of the invention to provide a mechanism for providing a relatively flat temperature profile across the surface of the gas distribution or baffle plate, thereby improving both high and low temperature within-wafer process uniformity.

SUMMARY OF THE INVENTION

A plasma processing system is provided, having processor chamber walls and/or a gas distribution or baffle plate equipped with integral cooling passages for reducing an operating temperature thereof during processing of a wafer by the system. Cooling medium inlets and outlets are connected to the cooling passages to permit circulation of a cooling medium through the cooling passages. Preferably, the chamber walls and the gas distribution or baffle plate are comprised of aluminum and the cooling passages are machined directly therein. The cooling medium may be either liquid (e.g., water) or gas (e.g., helium or nitrogen).

The baffle plate comprises a generally planar, apertured, gas distribution central portion surrounded by a flange, into both of which the cooling passages may extend. The cooling passages in the chamber walls and those in the gas distribution or baffle plate may be in communication with one another so as to permit them to share a single coolant circulating system. Alternatively, the cooling passages in the chamber walls and those in the gas distribution or baffle plate may not be in communication with one another, so as to provide independent circulating systems (gas or liquid) for each, thereby enabling independent temperature control and individual flow control thereof. In operation, the cooling medium in the chamber wall cooling passages is maintained approximately within the range of 15° C.–30° C., and the cooling medium in the gas distribution or baffle plate cooling passages is maintained approximately within the range of 15° C.–80° C.

DETAILED DESCRIPTION OF A PREFERRED EMBODIMENT

Figure 1:
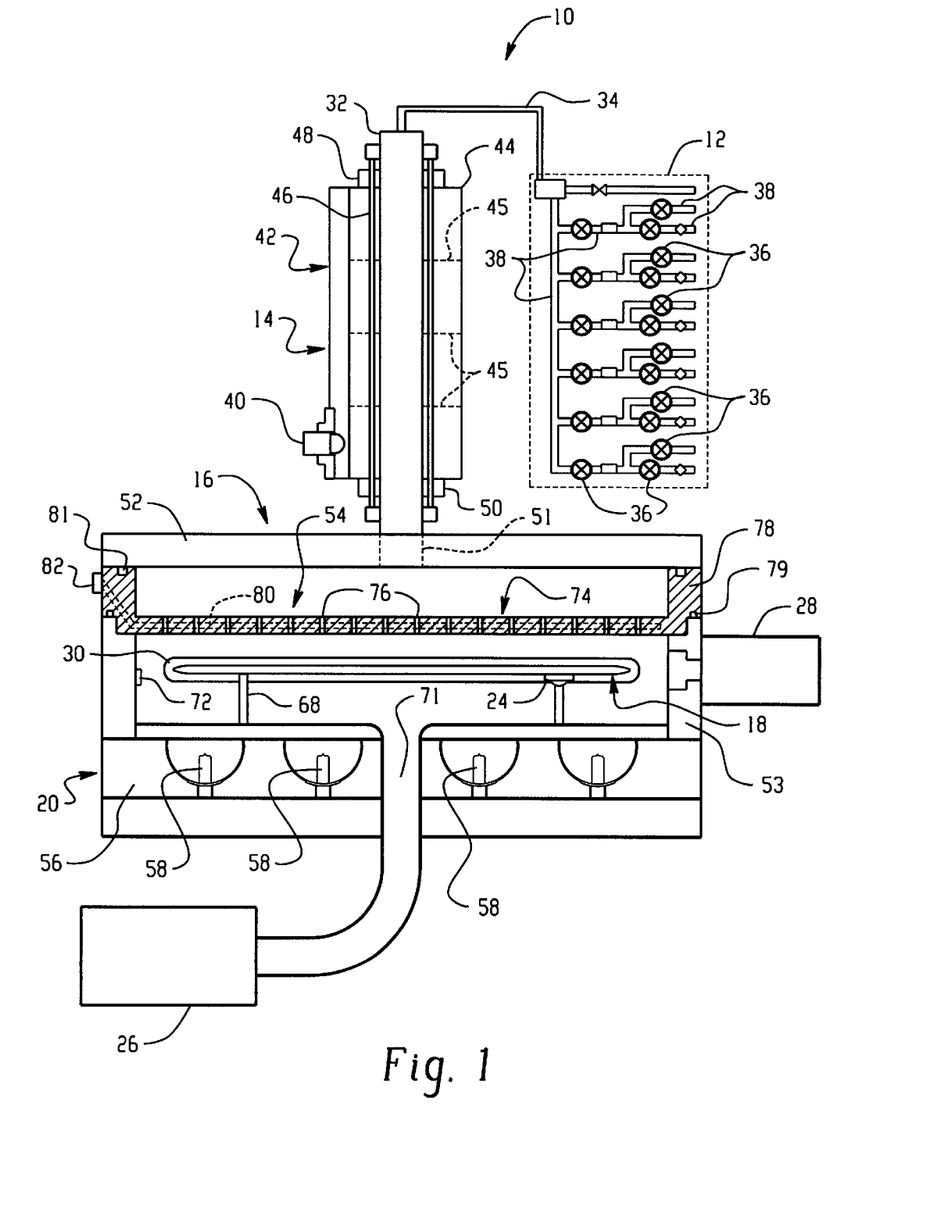
FIG. 1 is a sectional view of a photoresist asher into which is incorporated a first embodiment of a baffle plate constructed according to the present invention.

Referring now to the drawings, FIG. 1 discloses a prior art photoresist asher 10, comprising a gas box 12; a microwave plasma generator assembly 14; a process chamber 16 defining an interior cavity in which is heated a semiconductor substrate such as a wafer 18; and a radiant heater assembly 20 for heating the wafer 18, situated at the bottom of the process chamber. A temperature probe 24, such as a thermocouple, is used to monitor the temperature of the wafer 18. A vacuum pump 26 is used to evacuate the process chamber 16 for processes requiring vacuum conditions.

A monochromator 28 is used to monitor the optical emission characteristics of gases within the chamber to aid in process endpoint determination. The wafer 18 is introduced into and removed from the process chamber via an appropriate load lock mechanism (not shown) via entry/exit passageway 30. Although the present invention is shown as being implemented within a photoresist asher, it may also be used in other semiconductor manufacturing equipment, such as residue removal and strip processes.

In operation, a desired mixture of gases is introduced into a plasma tube 32 from gas box 12 through an inlet conduit 34. The plasma tube 32 is made of alumna ($Al_2O_3$) or sapphire to accommodate fluorine chemistries without etching or other degradation. The gases forming the desired mixture are stored in separate supplies (not shown) and mixed in the gas box 12 by means of valves 36 and piping 38. One example of a desired gas mixture is forming gas (primarily nitrogen with a small percentage of hydrogen), and oxygen. A fluorine containing gas such as carbon tetrafluoride ($CF_4$) may be added to the gas mixture to increase ashing rates for certain processes.

The desired gas mixture is energized by the microwave plasma generator assembly 14 to form a reactive plasma that will ash photoresist on the wafer 18 in the process chamber 16 when heated by the radiant heater assembly 20. A magnetron 40 generates microwave energy that is coupled to a waveguide 42. Microwave energy is fed from the waveguide through apertures (not shown) in microwave enclosure 44, which surrounds the plasma tube 32.

An outer quartz cooling tube 46 surrounds the plasma tube 32, slightly separated therefrom. Pressurized air is fed into the gap between the tubes 32 and 46 to effectively cool the tube 32 during operation. The microwave enclosure 44 is segmented into sections shown by phantom lines 45. Segmentation of the enclosure 44 allows uniform microwave power distribution across the length of the alumna or sapphire plasma tube, and protects it from overheating by preventing an unacceptably large thermal gradient from developing along its axial length when suitable input power is provided. Each segment of the enclosure 44 is separately fed with microwave energy that passes through the quartz tube 46 and the alumna or sapphire tube 32 passing therethrough.

The gas mixture within the plasma tube 32 is energized to create a plasma. Microwave traps 48 and 50 are provided at the ends of the microwave enclosure 44 to prevent microwave leakage. Energized plasma (typically having a temperature of about 150° C.) enters the process chamber 16 through an opening 51 in the top wall 52 thereof.

Positioned between the top wall 52 of the plasma chamber 16 and the wafer 18 being processed is a first preferred embodiment of the inventive gas distribution (or baffle) plate 54 of the present invention. Although shown as single member baffle plate, it is contemplated that the baffle plate may take the form of a dual-layered baffle plate assembly 154 (FIGS. 3–7) comprising upper and lower baffle plates. In either embodiment, the baffle plate 54 (FIGS. 1–2) and the baffle plate assembly 154 (FIGS. 3–7) evenly distribute the reactive plasma across the surface of the wafer 18 being processed, and provide means for cooling the gases within the plasma to achieve desired process results.

With reference back to FIG. 1, in operation, the reactive plasma passes through the baffle plate 54 and ashes the photoresist on the wafer 18. The radiant heater assembly 20 comprises a plurality of tungsten halogen lamps 58 residing in a reflector 56 that reflects and redirects the heat generated by the lamps toward the backside of the wafer 18 positioned within the process chamber 16 on quartz or ceramic pins 68. One or more temperature sensors 72, such as thermocouples, are mounted on the interior of process chamber side wall 53 to provide an indication of wall temperature.

Figure 2:
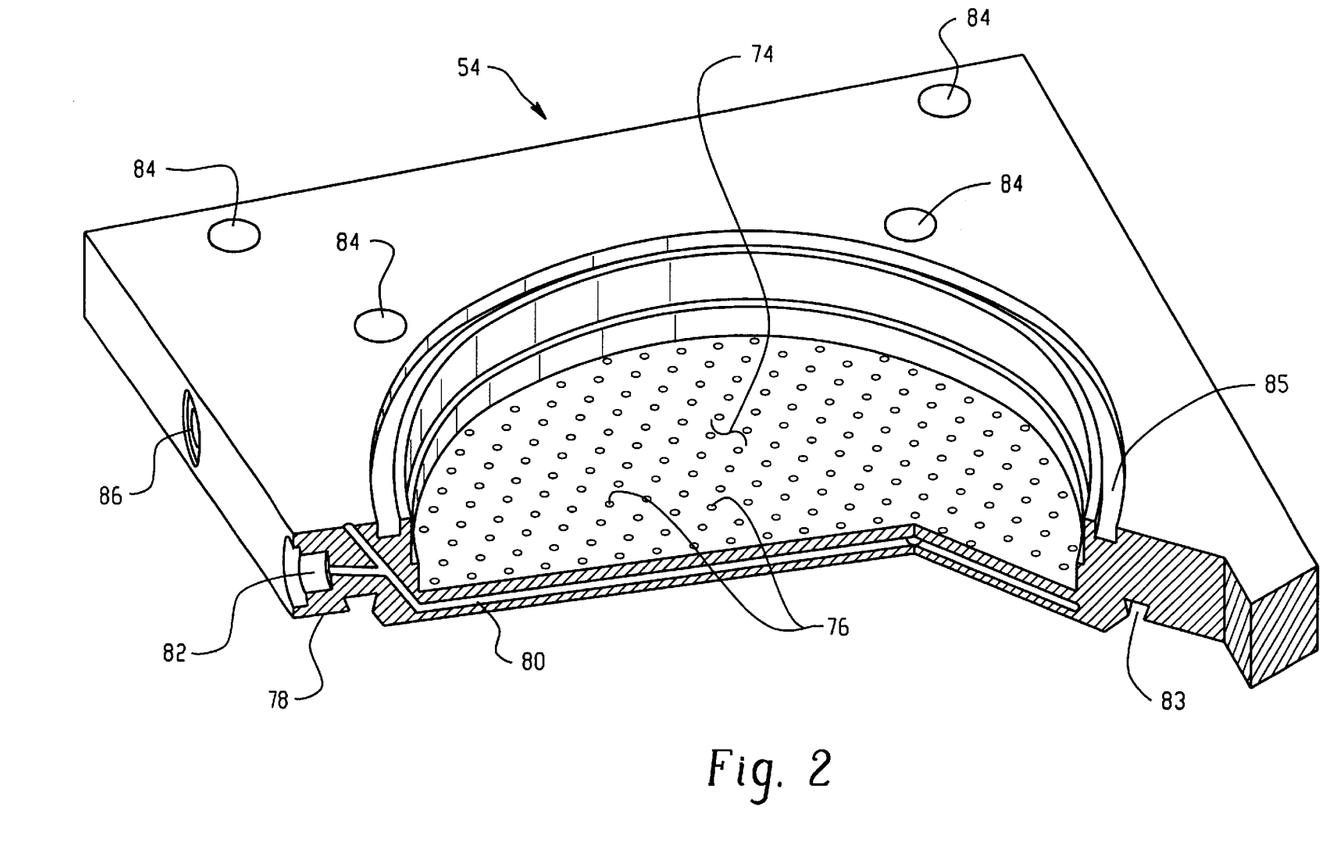
FIG. 2 is a partial cutaway, perspective view of the first embodiment of the baffle plate of FIG. 1.

The baffle plate 54 shown in the photoresist asher 10 of FIG. 1 is shown in greater detail in FIG. 2, which is designed for incorporation into a 200 millimieter (mm) wafer processing system. The baffle plate 54 comprises a generally planar gas distribution central portion 74, having apertures 76 therein, surrounded by a flange 78. The flange 78 surrounds the central portion and seats intermediate the process chamber side wall 53 and top wall 52 (see FIG. 1). Seals 79 and 81, respectively, provide air tight connections between the flange 78 and the side wall 53, and between the flange 78 and the top wall 52. The seals 79 and 81 reside in grooves 83 and 85, respectively, located in the flange 78 (see FIG. 2). The flange 78 also provides mounting holes 84 for mounting to the top wall 52 and side wall 53.

The central apertured portion 74 of the baffle plate 54 is provided with internal cooling passages 80 connected to cooling medium inlet 82 and outlet 86. The cooling passages 80 reduce the operating temperature of the baffle plate 54, and extend about its central portion 74 in a configuration that avoids intersection with any of the apertures 76. In the preferred embodiment, water is used as the cooling medium, although other liquids (e.g., oil) or gases (e.g., helium or nitrogen) having a high heat capacity are contemplated. As reactive gases pass through the apertures 76, the cooled baffle plate functions as a heat exchanger to remove heat from the reactive gases, thereby reducing its temperature. The baffle plate 54 also minimizes mobile ion contamination that can potentially cause wafer device damage, for example, weakening the dielectric strength of gate oxides.

The baffle plate is preferably formed from a single piece of low-alloy anodized aluminum (e.g., Alcoa type C-276), which significantly improves the heat transfer characteristics of the baffle plate over known quartz baffle plates. The use of aluminum also permits the cooling passages to be drilled or machined directly therein. This makes the baffle plate less sensitive to inconsistencies in the reflector heating system and parasitic heating from the wafer, and allows for operation at a substantially uniform temperature.

The use of aluminum also blocks a large percentage of ultraviolet (UV) energy emanating from the plasma tube that would otherwise make temperature control more difficult and possibly cause wafer device damage. Operating at a uniform surface temperature and minimizing exposure to UV radiation provides a substantial improvement in reaction rate uniformity across the surface of the wafer over known quartz baffle plates. In addition, maintaining a consistent baffle plate temperature eliminates the "first wafer effects" due to parasitic heating of the baffle plate as successive wafers are placed in the process chamber and heated to process temperature by the radiant heating system.

Figure 3:
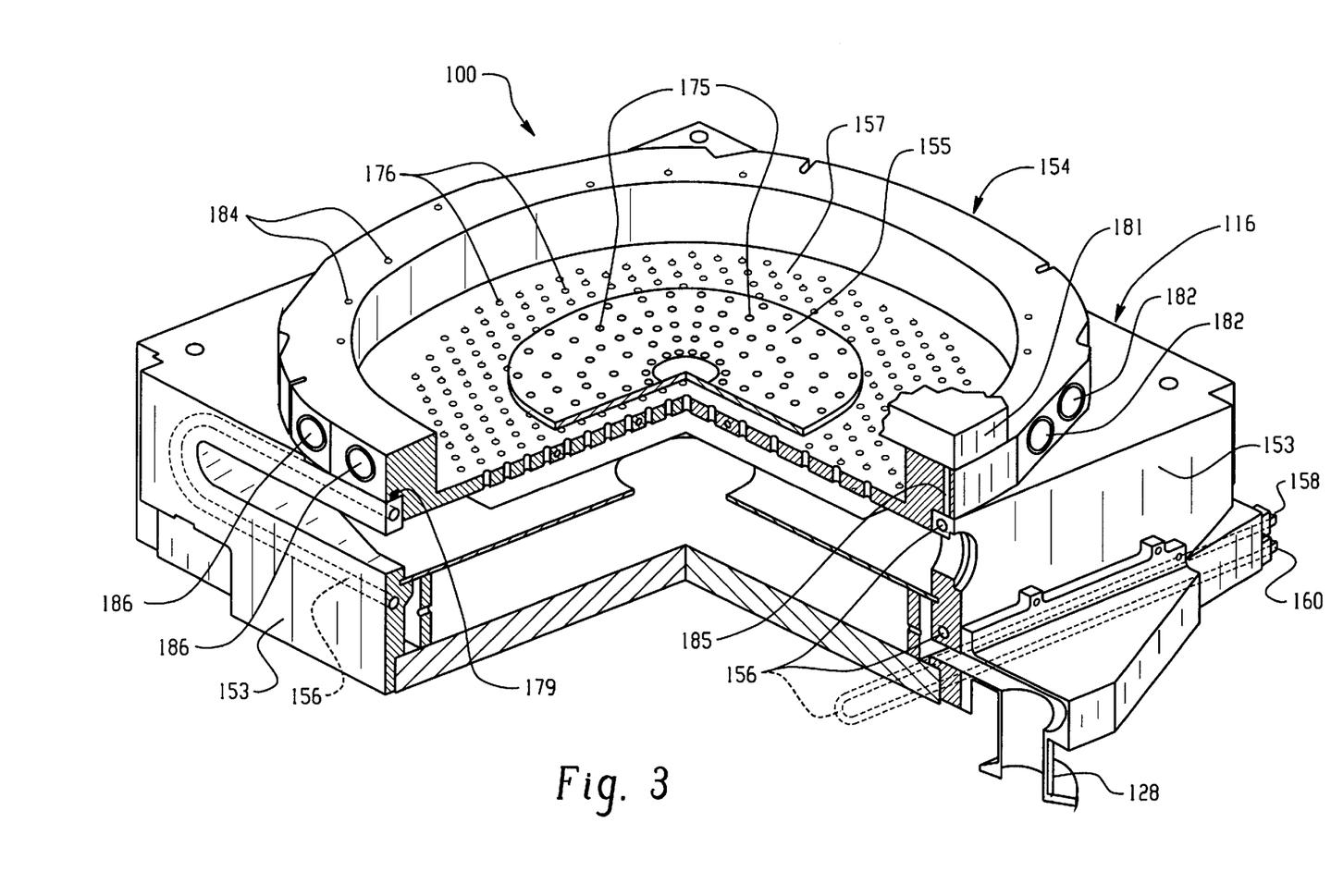
FIG. 3 is a partial cutaway, perspective view of a photoresist asher chamber assembly into which is incorporated a second embodiment of a baffle plate assembly constructed according to the present invention.

FIG. 3 shows a second embodiment of the invention, in which the baffle plate takes the form of the baffle plate assembly 154, which is designed for incorporation into a 300 millimeter (mm) wafer processing system. FIG. 3 is a partial cutaway, perspective view of a 300 mm photoresist asher chamber assembly 100 (shown without an associated radiant heater assembly) into which is incorporated this baffle plate assembly 154. The baffle plate assembly 154 comprises a generally planar upper baffle plate 155 and lower baffle plate 157 positioned generally parallel to each other and separated from one another. The assembly 154 is shown attached to the 300 mm process chamber 116. The upper and lower baffle plates 155 and 157, respectively, are provided with apertures 175 and 176. The apertures 175 in the upper baffle plate are slightly larger than the apertures 176 in the lower baffle plate. A process chamber access port 128 is provided for either a vacuum pump or a monochromator.

In this second embodiment of the invention, both the baffle plate assembly 154 and the process chamber 116 may be provided with active cooling mechanisms. With regard to the process chamber, internal cooling channels 156 are provided in the side walls 153 thereof. Cooling medium inlets 158 and 160, respectively, are provided to permit entry and exit of a cooling medium, such as water, and out of the cooling channels. The process chamber side walls 153 are preferably formed from low-alloy anodized aluminum (e.g., Alcoa type C-276), which permits the cooling passages 156 to be drilled or machined directly therein, thereby making the side walls less sensitive to inconsistencies in the reflector heating system, and allowing for operation at a substantially uniform process temperature.

Although the lower baffle plate 157 provided with active cooling, as explained further below, the upper baffle 155 plate is also not provided with an active cooling mechanism. The upper baffle plate 155 is comprised merely of a solid, apertured quartz plate, attached to the lower plate by means of posts 161 at attachment points 159 (see FIG. 4 and 6). The upper baffle plate, which may be sapphire coated, functions to divert a portion of the hot gaseous plasma which does not pass through its apertures 175 radially outward, so as to prevent the radially inward potion of the wafer 18 being processed from overheating and to promote reaction rate uniformity. A non-apertured sapphire plate 177 (FIGS. 5 and 6) covers the central portion of the upper baffle plate 155.

Figure 4:
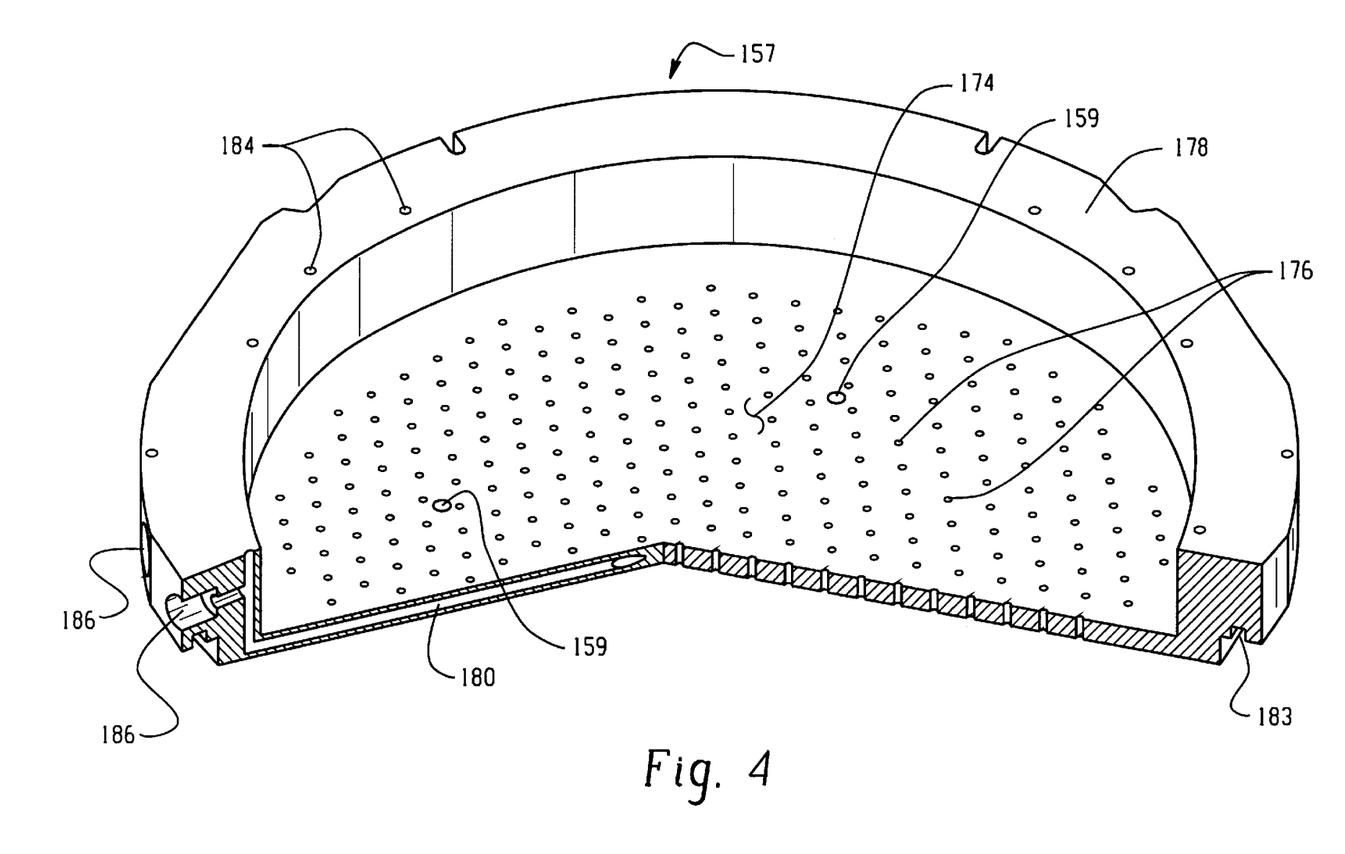
FIG. 4 is a partial cutaway, perspective view of a lower baffle plate of the second embodiment of the baffle plate assembly of FIG. 3.
Figure 5:
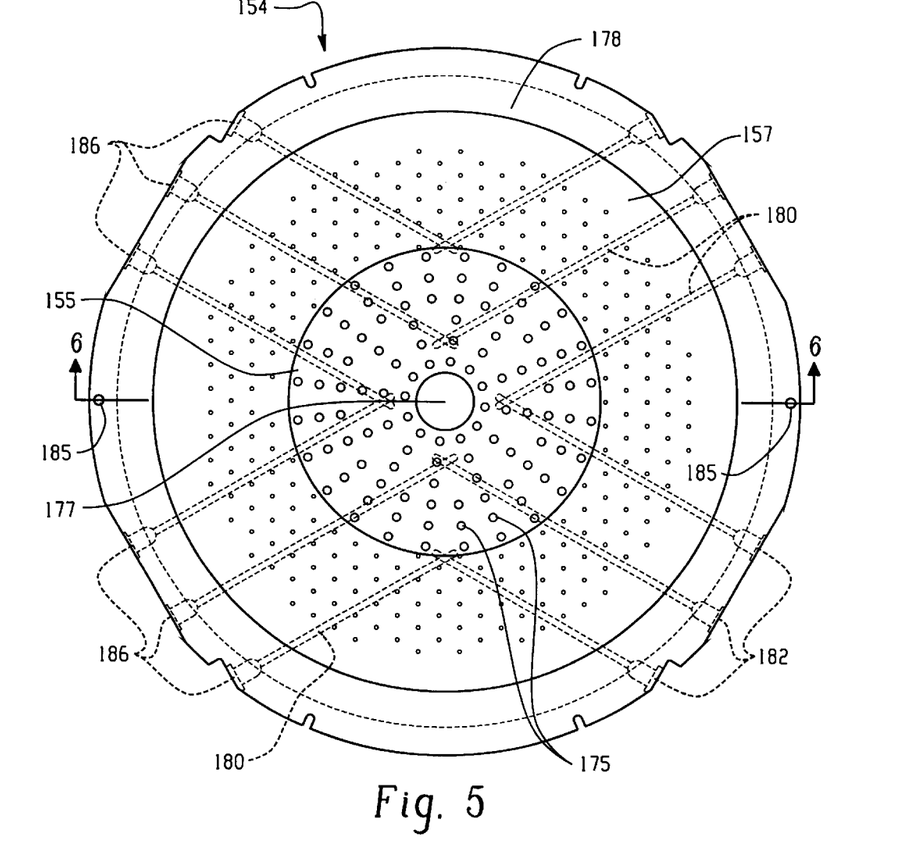
FIG. 5 is a plan view of the baffle plate assembly shown in FIG. 3.

The active cooling mechanism provided by the lower baffle plate 157 is more clearly shown in its partial cutaway, perspective view in FIG. 4. The lower baffle plate 157 comprises a generally planar gas distribution central portion 174, having the apertures 176 therein, surrounded by a flange 178. The flange 178 provides the surface to which a top wall 181 of the process chamber 116 may be attached using mounting holes 184. Seal 179 provides an airtight connection between the flange 178 and the side wall 153 (FIG. 3). The seal 179 resides in a groove 183 in flange 178 (FIG. 4).

Figure 6:
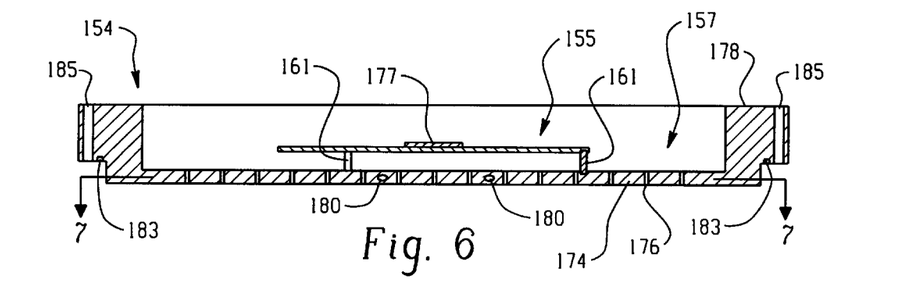
FIG. 6 is a sectional view of the baffle plate assembly of FIG. 5, taken along the lines 6—6.
Figure 7:
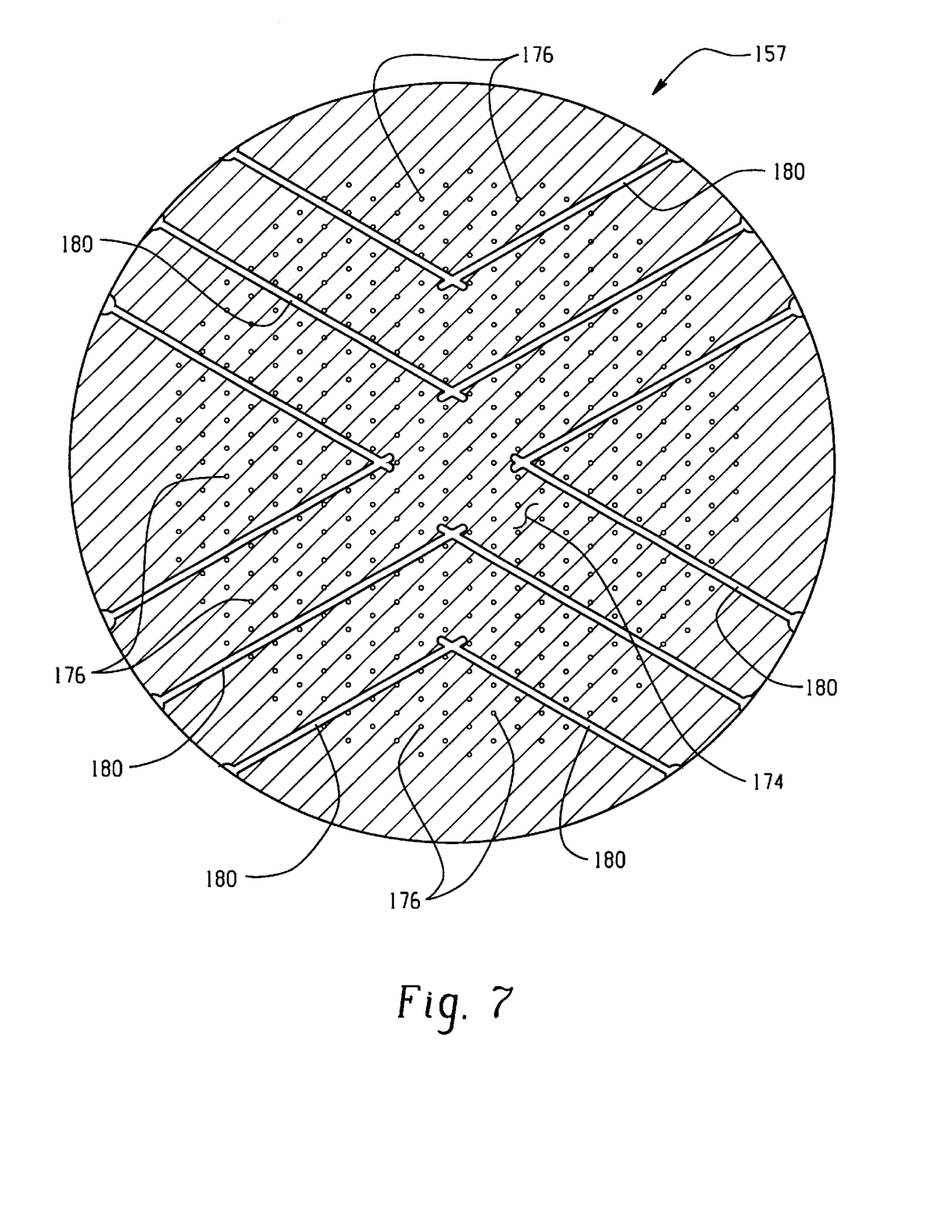
FIG. 7 is a sectional view of the baffle plate assembly of FIG. 6, taken along the lines 7—7.

The central apertured portion 174 of the baffle plate 157 is provided with internal cooling passages 180 connected to cooling medium inlet 182 and outlet 186 (FIG. 3). As shown in FIGS. 4 and 6, the cooling passages 180 may extend from the flange 178 into and about the central portion 174 in a configuration that avoids intersection with any of the apertures 176. One preferred configuration is shown in FIG. 7.

Still further, the cooling channels may also extend into the process chamber top wall. These individual cooling subsystems of these structural components (i.e., baffle plate, side walls and top wall) function to reduce the operating temperatures thereof. The cooling subsystems may either share a single gas or liquid coolant circulating system, or may be provided with independent circulating systems (gas or liquid) so as to provide independent temperature control and individual flow control thereof. Also, in embodiments of the invention wherein active cooling of the process chamber side walls and top wall are also provided, by maintaining these chamber surfaces at between 15° C.–30° C. (just above the dew point), the wafer can remain sufficiently cool to prevent photoresist cracking during, for example, high-density ion implanted (HDII) wafer ash procsses.

The cooling passages minimize the spatial temperature gradient across the surface of the lower baffle plate 157 and maintain the entire surface of the baffle plate at a uniform temperature. The cooling medium such as water (maintained, e.g., at 15° C.–80° C.) flows into the channels 180 via inlets 182 and flows out via outlets 186 (FIGS. 5 and 7), using a deionized water recirculating system including an air-cooled chiller assembly. The chiller assembly has a heat removal capacity greater than the heat generation rate of the process chamber even during rapid heating of the wafer.

Although water is used in the preferred embodiment as the cooling medium, other high heat capacity liquids or gases may be used, depending upon the required operating temperature of the lower baffle plate. For example, the lower baffle plate can be operated at up to 250° C. to remove process residues from the surface of the plate. These residues may otherwise condense and remain on the surface of the lower plate if not periodically exposed to higher temperatures during wafer processing. At lower operating temperatures (e.g., 15° C.–80° C.), as reactive gases pass through the apertures 176, the lower baffle plate 157 functions as a heat exchanger to remove heat from the reactive gases, thereby reducing their temperature.

The lower baffle plate 157 is preferably formed from a single piece of low-alloy anodized aluminum (e.g., Alcoa type C-276), which improves the heat transfer characteristics of the baffle plate over known quartz baffle plates. The use of aluminum also permits the cooling passages to be drilled or machined directly therein. This makes the baffle plate less sensitive to inconsistencies in the reflector heating system and parasitic heating from the wafer, and allows for operation at a substantially uniform temperature.

The use of aluminum also blocks a large percentage of ultraviolet (UV) energy emanating from the plasma tube that would otherwise make temperature control more difficult and possibly cause wafer device damage. Operating at a uniform surface temperature and minimizing exposure to UV radiation provides a substantial improvement in reaction rate uniformity across the surface of the wafer over known quartz baffle plates. In addition, maintaining a; consistent baffle plate temperature eliminates the "first wafer effects" due to parasitic heating of the baffle plate as successive wafers are placed in the process chamber and heated to process temperature by the radiant heating system.

A pressure drop across the lower baffle plate 157 distributes the gas flow across the upper surface of the plate, in addition to increasing the heat transfer rate between the gas and the plate surfaces. This same effect, in combination with the upper quartz plate 155, reduces mobile ion contamination that can potentially cause device damage such as compromising the dielectric strength of gate oxides. The combination of the quartz upper plate 155 and the aluminum lower plate 157 in the dual-layered baffle plate assembly 154 has been found to be suitable for use in the corrosive conditions found in a process chamber used for photoresist removal, even when corrosive element-producing gases such as $CF_4$ are utilized.

In operation, the systems 10 (200 mm) and 100 (300 mm) have been operated using the water-cooled baffle plate 157 and the baffle plate assembly 154, respectively, at maximum microwave power, under which conditions the gas temperatures have been reduced below the minimum expected process temperature, typically 80° C. Also, it has been possible to obtain a relatively flat temperature profile across the surface of the wafer during processing, resulting in reduced process non-uniformity due to the gas and radiation cooling effects of the cooled lower baffle plate. Active cooling of the lower baffle plate also reduces thermal loading of the baffle plate by the first-processed wafer to improve wafer-to-wafer process uniformity.

In one example, a 270° C. ashing process was run while flowing water at 30° C. through the lower baffle plate 157 at a flow rate of 0.4 gallon per minute (gpm). An ash rate of 5.59 microns per minute was achieved with a 2.25% ash rate non-uniformity across the wafer. An ash rate of 5.66 microns per minute with a 6.2% ash rate nonuniformity across the wafer was obtained with a prior quartz non-actively cooled baffle plate. These test results show that using an actively-cooled baffle plate provides significant improvements in the area of process uniformity with minimal effect on ash rates.

Accordingly, a preferred embodiment of a method and system for cooling the reactive gases in a plasma processing system, as well as the wafer being processed, has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A gas distribution plate for a plasma processing system, comprising:
   (i) a generally planar central portion having apertures therein for permitting gas to pass therethrough;
   (ii) cooling passages for accepting a flow of cooling medium to reduce an operating temperature of said gas distribution plate, said cooling passages disposed within said generally planar central portion of the gas distribution plate and extending between and substantially perpendicularly to said apertures;
   (iii) a cooling medium inlet and a cooling medium outlet connected to said cooling passages to permit circulation of a cooling medium therethrough;
   (iv) a generally planar upper baffle plate attached to said gas distribution plate and separated by a distance therefrom, said upper baffle plate provided with apertures; and
   (v) a non-apertured plate overlying and covering apertures in a central portion of the upper baffle plate.

2. The gas distribution plate of claim 1, wherein said central portion is surrounded by a flange, said cooling passages extending from said flange into said apertured central portion.

3. The gas distribution plate of claim 1, wherein said plate is comprised of low-alloy anodized aluminum and said cooling passages are machined therein.

4. The gas distribution plate of claim 1, wherein said cooling medium is a liquid.

5. The gas distribution plate of claim 4, wherein said cooling medium is water.

6. The gas distribution plate of claim 1, wherein said cooling medium is a gas.

7. The gas distribution plate of claim 6, wherein said cooling medium is helium or nitrogen.

8. The gas distribution plate of claim 1, wherein said apertures in the upper baffle plate are slightly larger than said apertures in the gas distribution plate.

9. The gas distribution plate of claim 1, wherein said upper baffle plate is comprised of quartz.

* * * * *